(12) United States Patent
Xu et al.

(10) Patent No.: US 8,710,146 B2
(45) Date of Patent: Apr. 29, 2014

(54) PARTICLES WITH HIGH SURFACE CHARGE FOR CRYSTALLINE COLLOIDAL ARRAYS

(75) Inventors: Xiangling Xu, Pittsburgh, PA (US); Sean Purdy, Allison Park, PA (US)

(73) Assignee: PPG Industries Ohio, Inc., Cleveland, OH (US)

(*) Notice: Subject to any disclaimer, the term of this patent is extended or adjusted under 35 U.S.C. 154(b) by 848 days.

(21) Appl. No.: 11/672,237

(22) Filed: Feb. 7, 2007

(65) Prior Publication Data
US 2008/0188381 A1 Aug. 7, 2008

(51) Int. Cl.
*B01J 13/14* (2006.01)
*C08F 2/22* (2006.01)

(52) U.S. Cl.
USPC .......................................... 524/800; 524/158

(58) Field of Classification Search
CPC .................................... B01J 13/14; C08F 2/22
USPC ........ 252/582–583; 506/20, 23; 524/800, 158
See application file for complete search history.

(56) References Cited

U.S. PATENT DOCUMENTS

| | | | | |
|---|---|---|---|---|
| 5,266,238 A | * | 11/1993 | Haacke et al. | 252/582 |
| 5,281,370 A | * | 1/1994 | Asher et al. | 264/1.1 |
| 5,330,685 A | | 7/1994 | Panzer | |
| 5,452,123 A | * | 9/1995 | Asher et al. | 359/296 |
| 6,165,389 A | * | 12/2000 | Asher et al. | 252/582 |
| 6,337,131 B1 | * | 1/2002 | Rupaner et al. | 428/403 |
| 6,894,086 B2 | | 5/2005 | Munro et al. | |
| 7,902,272 B2 | | 3/2011 | Ben-Moshe et al. | |
| 2002/0008229 A1 | * | 1/2002 | Asher et al. | 252/600 |
| 2002/0032246 A1 | * | 3/2002 | Asher et al. | 521/64 |
| 2003/0122112 A1 | * | 7/2003 | Foulger et al. | 252/582 |
| 2007/0165903 A1 | * | 7/2007 | Munro et al. | 382/100 |

OTHER PUBLICATIONS

Utracki, "Interpenetrating Polymer Networks", Polymer Blends Handbook 2002, pp. 427-431 Springer-Verlag.*
Xu et al. "Syntehsis and Utilization of Monodisperse Hollow Polymeric Particles in Photonic Crystals". JACS 2004, 125, pp. 7940-7945.*
Xu, Xiangling et al., "Synthesis and Utilization of Monodisperse Superparamagnetic Colloidal Particles for Magnetically Controllable Photonic Crystals", Chem. Mater., 2002, pp. 1249-1256, vol. 14, No. 3, American Chemical Society, USA.
Xu, Xiangling et al., "Superparamagnetic Photonic Crystals", Advanced Materials, Nov. 16, 2001, pp. 1681-1684, vol. 13, No. 22, Wiley-VCH Verlag GmbH, Weinheim, Germany.
Xu, Xiangling et al., "Mesoscopic Monodisperse Ferromagnetic Colloids Enable Magnetically Controlled Photonic Crystals", J. Am. Chem. Soc., 2002, pp. 13864-13868, vol. 124, American Chemical Society, USA.
Zeng, Fang et al., "Urea sensing materials via solidified crystalline colloidal arrays", Sensors and Actuators B, 2002, pp. 273-276, vol. 81, Elsevier Science B.V.
Zeng, Fang et al., "Preparation and dynamic viscoelastic properties of strengthened solidified colloidal crystals", Reactive & Functional Polymers, 2002, pp. 39-44, vol. 53, Elsevier Science B.V.
Nagao, Daisuke et al., "Preparation of highly monodisperse poly(methyl methacrylate) particles incorporating fluorescent rhodamine 6G for colloidal crystals", Journal of Colloid and Interface Science, 2006, pp. 232-237, vol. 298, Elsevier Inc.

* cited by examiner

*Primary Examiner* — Mark Eashoo
*Assistant Examiner* — Michael A Salvitti
(74) *Attorney, Agent, or Firm* — Julie W. Meder

(57) ABSTRACT

A method of preparing a dispersion of polymeric particles is disclosed. Monomers are emulsion polymerized in the presence of an ionic monomer to produce highly charged polymeric particles. At least 50% of the ionic monomer in the dispersion is bound to the polymeric particles.

14 Claims, No Drawings

PARTICLES WITH HIGH SURFACE CHARGE FOR CRYSTALLINE COLLOIDAL ARRAYS

STATEMENT REGARDING FEDERALLY SPONSORED RESEARCH OR DEVELOPMENT

This invention was made with Government support under contract #FA8650-05-2-5042 awarded by United States Air Force/Air Force Material Command. The United States Government has certain rights in this invention.

FIELD OF THE INVENTION

This invention relates to radiation diffractive materials, more particularly to periodic arrays of highly charged particles produced from monodispersed particles.

BACKGROUND OF THE INVENTION

Radiation diffractive materials based on crystalline colloidal arrays have been used for a variety of purposes. A crystalline colloidal array (CCA) is a three-dimensional ordered array of monodispersed colloidal particles. The particles are typically composed of a polymer latex such as polystyrene or an inorganic material, such as silica.

Such colloidal dispersions of particles can form crystalline structures having lattice spacings that are comparable to the wavelength of ultraviolet, visible or infrared radiation. These crystalline structures have been used for filtering narrow bands of selected wavelengths from a broad spectrum of incident radiation, while permitting the transmission of adjacent wavelengths of radiation. Alternatively, CCAs are fabricated to diffract radiation for use as colorants, markers, optical switches, optical limiters and sensors.

Many of these devices have been created by dispersing particles in a liquid medium, whereby the particles self-align into an ordered array. The particles are fused together by mutual polymerization or by introducing a solvent that swells and fuses the particles together.

Recently, other devices have been produced from hydrogels containing CCAs polymerized within the hydrogel. In hydrogel-based devices, similarly charged colloidal particles are dispersed in a low-ionic strength liquid media. The particles self-assemble into a CCA due to their electrostatic charges. These ordered structures diffract radiation according to Bragg's law, wherein the radiation meeting the Bragg conditions are reflected, while adjacent spectral regions that do not meet the Bragg conditions are transmitted through the device.

Other CCAs are produced from a dispersion of monodispersed particles bearing a similar charge in a carrier. The dispersion is applied to a substrate, and the carrier is evaporated to yield an ordered periodic array of the particles. The array is fixed in place by coating the array with a curable polymer. The fixed array, which diffracts radiation according to Bragg's law, may be used in place or may be removed from the substrate in the form of a film or as flakes.

An ordered periodic array of particles that diffracts radiation according to Bragg's law satisfies the equation:

$$m\lambda = 2nd \sin \theta$$

where m is an integer, $\lambda$ is the wavelength of reflected radiation, and n is the effective refractive index of the array, d is the distance between the layers of particles, and $\theta$ is the angle that the reflected radiation makes with the plane of a layer of particles. Incident radiation is partly reflected at an uppermost layer of particles in the array at angle $\theta$ to the plane of the first layer and is partially transmitted to underlying layers of the particles. While some absorption incident radiation occurs as well, a portion of the transmitted radiation is partially reflected at the second layer of particles in the array at angle $\theta$ and partially transmitted to the underlying layers of particles. This feature of partial reflection at angle $\theta$ and partial transmission to the underlying layers of particles continues through the thickness of the array. The wavelength ($\lambda$) of diffracted radiation can be controlled by the dimension (d), which may be the distance between the planes of the centers of the particles in each layer. Generally, the diffracted wavelength ($\lambda$) is proportional to the particle diameter (d) for an array of packed particles. Thus, the interparticle interaction is a factor in producing CCAs.

SUMMARY OF THE INVENTION

The present invention includes a method of preparing a dispersion of monodispersed polymeric particles comprising dispersing monomers in an emulsion comprising an ionic monomer, and polymerizing the monomers to produce monodispersed polymeric particles, wherein at least 50% of the ionic monomer in the dispersion is bound to the polymeric particles. The present invention also includes a dispersion of monodispersed polymeric particles having an ionic monomer bound thereto, the ionic monomer comprising sodium styrene sulfonate.

DETAILED DESCRIPTION OF THE INVENTION

The present invention includes a method of producing a monodispersion of polymeric particles and a method of producing an ordered periodic array of particles (CCA) and a plurality of layers of such particles held in a polymeric matrix. A monodispersion is achieved according to the present invention by producing polymeric particles bearing a similar charge. The presence of a similar charge on the particles causes the particles to repel each other and remain monodispersed and also causes the particles to self-align into an ordered periodic array. One mechanism for providing the surfaces of the particles with charge is to produce the particles via emulsion polymerization in the presence of an ionic monomer. The ionic monomer becomes bound to the polymer particle thereby providing charge (typically, a negative charge) to the particle.

The monodispersed particles self-align into an array of particles that satisfies Bragg's law of:

$$m\lambda = 2nd \sin \theta$$

where m is an integer, n is the effective refractive index of the array and d is the distance between the layers of particles, and $\lambda$ is the wavelength of radiation reflected from the plane of a layer of the particles at angle $\theta$.

Various compositions may be used for the particles, including, but not limited to, organic polymers such as polystyrene, polyurethane, acrylic polymers, alkyd polymers, polyesters, siloxane-containing polymers, polysulfides, epoxy-containing polymers and inorganic materials such as metal oxides (e.g., alumina, silica or titanium dioxide) or semi-conductors such as cadmium. Alternatively, the particles may have a core-shell structure where the core can be produced from the same materials as the above-described unitary particles. The shell may be produced from the same polymers as the core material, with the polymer of the particle shell differing from the core material for a particular array of the core-shell particles. The core material and the shell material have different indices of refraction. In addition, the refractive index of the shell may vary as a function of the shell thickness in the form of a gradient of refractive index through the shell thickness. The shell material is non-film-forming, whereby the shell material remains in position surrounding each particle core without forming a film of the shell material so that the core-shell particles remain as discrete particles within the polymeric matrix.

Typically, the particles are generally spherical. For core-shell particles, the diameter of the core may constitute 80 to 90% of the total particle diameter or 85% of the total particle diameter with the shell constituting the balance of the particle diameter and having a radial thickness dimension.

In one embodiment, the particles with a unitary structure (not core-shell) are produced in an emulsion polymerization process, such as free radical initiated polymerization, using an ionic monomer, yielding a dispersion of polymeric particles.

According to the present invention, useful ionic monomers are those having a sufficient affinity for the polymer particles to produce high surface charge on the particles, such that they readily self-assemble into a periodic array. The ionic monomer binds with the polymeric particles and exhibits a charge, thereby producing charged particles. The ionic monomer may be an ionic surfactant, but can be an ionic monomer that is not a surfactant.

According to the present invention, the ionic monomer has an affinity with the polymeric particles such that at least 50% of the ionic monomer (in its disassociated, ionic state) that is added to the emulsion polymerization dispersion becomes bound to the particles. Alternatively, at least 70% or at least 90% of the disassociated, ionic monomer added to the dispersion is bound to the polymeric particles. This high affinity of the ionic monomer for the polymeric particles improves the efficiency with which the ionic monomer is used in the emulsion polymerization. A high percentage of the total ionic monomer added to the reaction mixture binds with the polymeric particles and is demonstrative of a higher binding efficiency of the ionic monomer. "Binds with", "bound to the polymeric particles" and like terms, when used in reference to the ionic monomer, means that the ionic monomer becomes covalently or otherwise bound to the particle, and/or that the ionic monomer itself becomes part of the polymer that comprises the particle. The bound ionic polymer, regardless of how it's bound, remains substantially attached to and/or part of the particle during purification.

An ionic monomer that has commonly been used to prepare monodispersed particles for making CCAs is a sodium salt of 3-allyloxy-2-hydroxy-1-propanesulfonic acid (COPS-1). COPS-1 provides a negative charge to the polymer particles.

In previous methods of producing charged particles with ionic monomer, a relatively low percentage of ionic monomer added to the emulsion polymerization reaction mixture was bound to the particles. While such ionic monomers (such as COPS-1) functioned to achieve a monodispersion of charged polymeric particles, because the affinity of the ionic monomers for the particles was relatively low, a high concentration of ionic monomer was needed to ensure the level of charge on the particles needed to be able to form a CCA. Moreover, regardless of the amount of COPS added to the emulsion polymerization, much less than 50% of the COPS in the dispersion would become bound to the polymeric particles. Thus, the charge density will be limited, in that a higher charge density will not be achieved by using more COPS.

In contrast, the present invention recognizes that selection of ionic monomers (which may or may not be surfactants) affects the concentration of such monomer used to ensure the level of charge on the particles needed for forming a SCA. Therefore, less total ionic monomer is used in the emulsion polymerization reaction mixture of the present invention than heretofore has been needed. In addition, ionic monomers previously used, as opposed to those used according to the present invention, will not result in the charge density, or percent binding to the polymeric particle, that is presently achieved. It has been found that improved alignment of the particles in an ordered periodic array can be achieved using monodispersions prepared according to the present invention as compared to monodispersions of polymer particles prepared without due regard to the affinity of the surfactant or monomer for the polymeric particles. Accordingly, by selecting an ionic monomer having the desired level of binding or affinity with the polymeric particles, less total amount of ionic monomer is needed to prepare the dispersion.

Particularly useful ionic monomers are those that are minimally soluble in the dispersing fluid (e.g., water) of the particle dispersion. As a result, subsequent purification of the monodispersion is enhanced because such a large percent of ionic monomer becomes bound to the particle and remains in the dispersion. In addition, improved binding of an ionic monomer to the polymeric particles increases the surface charge of the particles and improves the integrity and robustness of an array of the particles.

The charged particles are purified from the dispersion by techniques such as ultra-filtration, dialysis or ion-exchange to remove undesired materials, such as unbound ionic monomer, unreacted other monomer, small polymers, water, initiator, unbound salt and grit (agglomerated particles) to produce a monodispersion of charged particles. When such particles are in a dispersion with other materials, such as unbound ionic monomer, the repelling forces of the charged particles can be mitigated, therefore, the particle dispersion is purified to essentially contain only the charged particles, which then readily repel each other and form an ordered array. Upon removal of the excess raw material by-products, solvent and the like, electrostatic repulsion of the charged particles causes the particles to align themselves into an ordered array.

To produce a CCA, the purified monodispersed particles are applied to a substrate and dried. The dispersion of particles applied to the substrate may contain 10-70 vol. % of charged particles or 30-65 vol. % of charged particles. The support or substrate may be a flexible material, such as polyester film, polyethylene terephthalate (PET) or a microporous sheet such as those sold by PPG Industries, Inc. as TESLIN, or an inflexible material, such as glass. The dispersion can be applied to the substrate by dipping, spraying, brushing, roll-coating, curtain coating, flow-coating or die-coating to a desired thickness. The wet coating may be 4-50 microns, such as 40 microns. Upon drying, material is about one-half the thickness of the wet coating and contains essentially only the particles that have self-aligned in a Bragg array and diffract radiation accordingly.

In another embodiment of the invention, core-shell particles are produced by dispersing core monomers with initiators in solution to produce core particles. Shell monomers are added to the core particle dispersion, along with an ionic monomer (as described above for unitary particles), such that the shell monomers polymerize onto the core particles. The core-shell particles are purified from the dispersion by similar means as described above to produce a dispersion of only the charged particles, which then form an ordered array on a substrate when applied thereto.

The array of particles is fixed in a polymeric matrix by providing the particles onto a substrate as described above, coating the array of particles with a fluid curable matrix composition including monomers or other polymer precursor materials and curing the coating. In one embodiment, the matrix composition may be a polymer such as an acrylic polymer, a polyurethane, an alkyd polymer, a polyester, a siloxane-containing polymer, a polysulfide, and an epoxy-containing polymer. Suitable methods for producing the CCA material of the present invention from highly charged, monodispersed particles are disclosed in U.S. Pat. No. 6,894,086 (incorporated herein by reference). In certain embodiments, the particles (unitary or core-shell) that have self-aligned in a dried array are interpenetrated with the fluid curable matrix composition, such as a UV curable composition. The polymer precursor material may be applied to the packed array of particles via dipping, spraying, brushing, roll coating, gravure coating, curtain coating, flow coating, slot-die coating, or ink-jet coating. The matrix composition is cured (such as by exposure to ultra-violet light) to fix the array of packed particles. Other curing mechanisms may be used to fix the matrix composition around the particles. By coating, it is meant that the polymer precursor material covers the entirety of the array and fills at least some of the interstitial spaces between the particles. The CCA material diffracts radiation according to Bragg's law in the visible or invisible spectrum.

For CCA material having the core-shell particles, upon interpenetration of the array with a fluid curable matrix composition, some of the monomers of the matrix may diffuse into the shells, thereby increasing the shell thickness (and particle diameter) until the matrix composition is cured. Solvent may also diffuse into the shells and create swelling. The solvent is ultimately removed from the array, but this swelling from solvent may impact the final dimensions of the shell. The length of time between interpenetration of monomers into the array and curing of the monomers, in part, determines the degree of swelling by the shells.

The CCA material of the present invention is non-gelatinous and substantially solid. By non-gelatinous, it is meant that the CCA material does not contain a fluidized material, such as water. The CCA material of the present invention substantially only includes the particles and the polymeric matrix with some possible residual solvent and, thus, is substantially solid. The volumetric ratio of the particles to the polymer matrix in the CCA material is typically about 25:75 to about 80:20.

The CCA material may be applied to an article in various ways. The CCA material may be removed from a substrate and comminuted into particulate form, such as in the form of flakes. The comminuted CCA material may be incorporated as an additive in a coating composition, such as paint or ink for applying to an article. Alternatively, the CCA material may be applied directly to an article. In addition, the CCA material may be produced in the form of a film or sheet, which is then applied to an article such as via an adhesive or the like.

As used herein, unless otherwise expressly specified, all numbers such as those expressing values, ranges, amounts or percentages may be read as if prefaced by the word "about", even if the term does not expressly appear. Any numerical range recited herein is intended to include all sub-ranges subsumed therein. Plural encompasses singular and vice versa. For example, while reference is made herein to "an" ionic monomer, "particles", and the like, more than one of these things or mixtures of these things can be used. Also, as used herein, including the claims, the term "polymer" is meant to refer to prepolymers, oligomers and both homopolymers and copolymers; the prefix "poly" refers to two or more.

These exemplary uses of CCA materials are not meant to be limiting. In addition, the following examples are merely illustrative of the present invention and are not intended to be limiting.

EXAMPLES

Example 1

A dispersion of polystyrene particles in water was prepared via the following procedure.

Sodium bicarbonate (2.0 g) from Aldrich Chemical Company, Inc., 8.0 g Aerosol MA80-1 from Cytec Industries, Inc., 3.0 g Brij 35 (polyoxyethylene(23)lauryl ether) from the Aldrich Chemical Company, Inc., and 2.5 g sodium styrene sulfonate (SSS) from Aldrich Chemical Company, Inc., were mixed with 2400 g deionized water and added to a 5-liter reaction kettle equipped with a thermocouple, heating mantle, stirrer, reflux condenser and nitrogen inlet. The mixture was sparged with nitrogen for 45 minutes with stirring and then blanketed with nitrogen. After that, a mixture of 650 g styrene monomer and 25 g divinylbenzene from Aldrich Chemical Company, Inc., were added with stirring. The mixture was then heated to 60° C. and held constant for 30 minutes. Sodium persulfate from the Aldrich Chemical Company, Inc. (6 g in 200 g deionized water) was then added to the mixture under stirring. The temperature of the mixture was maintained at 60° C. for approximately 4.0 hours. The resulting polymer dispersion was filtered through a five-micron filter bag.

Twenty grams of the above dispersion was mixed with 10 g of mixed hydrogen and hydroxide ion exchange resin TMD-8 from Aldrich Chemical Company, Inc. for 24 hours under stirring. The TMD-8 ion exchange resin was then removed from the dispersion.

The percentage of ionic monomer on the purified polystyrene particle surfaces was determined as follows. Approximately 4 g of the polystyrene dispersion was baked at 110° C. for 1 hour to measure the solid content. Another 4 g of the polystyrene dispersion was titrated with 0.1 N NaOH to determine the amount of negative charge on the particle surfaces. It was determined that 0.26 weight percent of SSS was in the purified polymer dispersion. Therefore, 86 percent of the SSS added to the reaction mixture was polymerized on the particle surface.

Comparative Example 1

Example 1 was repeated, except that the sodium styrene sulfonate was replaced by 6.25 g Sipomer COPS-I (which contains 40% 3-allyloxy-2-hydroxy-1-propanesulfonic acid) from Rhodia, Inc. Cranbury, N.J. Using the same method to determine the affinity of SSS for the polymer particles described in Example 1, it was determined that 33% of COPS-I added to the reaction mixture was found to be bound to the particle surfaces.

Comparative Example 2

Example 1 was repeated, except that the sodium styrene sulfonate was replaced by 2.5 g of 2-acrylamido-2-methyl-1-propanesulfonic acid (AMPS). Using the same method to determine the affinity of SSS for the polymer particles described in Example 1, it was determined that 42% of the AMPS added to the reaction mixture was bound to the particle surfaces.

Example 2

A dispersion of poly(isobutylmethacrylate) in water was prepared via the following procedure.

Sodium bicarbonate (1.0 g), 2.5 g Aerosol MA80-I, 1.0 g Brij 35 (polyoxyethylene(23)lauryl ether), 0.3 g sodium styrene sulfonate, and 125 g ethylene glycol, were mixed with 975 g deionized water and added to a 2-liter reaction kettle equipped with a thermocouple, heating mantle, stirrer, reflux condenser and nitrogen inlet. The mixture was sparged with nitrogen for 45 minutes with stirring and then blanketed with nitrogen. After that, a mixture of 250 g isobutylmethacrylate (IBMA) monomer and 10 g ethylene glycol dimethacrylate, were added with stirring. The mixture was then heated to 60° C. and held constant for 30 minutes. Next, sodium persulfate (3 g in 100 g deionized water) was added to the mixture under stirring. The temperature of the mixture was maintained at 60° C. for approximately 4.0 hours. The resulting polymer dispersion was filtered through a five-micron filter bag.

Twenty grams of the dispersion was mixed with 10 g of mixed hydrogen and hydroxide ion exchange resin TMD-8 for 24 hours under stirring. The TMD-8 ion exchange resin was then removed from the dispersion.

Using the same method to determine the affinity of SSS for the polymer particles described in Example 1, it was determined that 73% of the sodium styrene sulfonate added to the reaction mixture was bound to the particle surfaces.

Comparative Example 3

Example 2 was repeated, except that the sodium styrene sulfonate was replaced by 0.3 g AMPS. Using the same method to determine SSS affinity described in Example 1, it was determined that 34% of the AMPS added to the reaction mixture was bound to the particle surfaces.

Comparative Example 4

Example 2 was repeated, except that the sodium styrene sulfonate was replaced by 0.3 g COPS-I. Using the same method to determine SSS affinity described in Example 1, it was determined that 24% of the COPS-I added to the reaction mixture was bound to the particle surfaces.

The binding efficiencies of sodium styrene sulfonate, COPS-1 and AMPS to polystyrene particles and poly(isobutylmethacrylate) particles of Examples 1 and 2 and Comparative Examples 1-4 (determined as described above) is summarized in Table 1. As shown therein, the affinity of SSS for both polystyrene particles and poly(isobutylmethacrylate) particles was at least twice that as for COPS-1 and AMPS.

TABLE 1

| Example | Particle Composition | Ionic Monomer | Percent Bound Ionic Monomer |
| --- | --- | --- | --- |
| Example 1 | polystyrene | SSS | 86% |
| Comparative Example 1 | polystyrene | COPS-1 | 33% |
| Comparative Example 2 | polystyrene | AMPS | 42% |
| Example 2 | poly(IBMA) | SSS | 73% |
| Comparative Example 3 | poly(IBMA) | COPS-1 | 34% |
| Comparative Example 4 | poly(IBMA) | AMPS | 24% |

These data demonstrate that at least for polystyrene particles and core-shell particles of polystyrene and poly(isobutylmethacrylate), referred to as poly(IBMA), the binding efficiency of ionic monomer thereto can be doubled by selecting an ionic monomer (such as sodium styrene sulfonate) having a high affinity for polymeric particles.

Comparative Example 5

A dispersion of polystyrene-divinylbenzene core/styrene-methyl methacrylate-ethylene glycol dimethacrylate-divinylbenzene shell particles in water was prepared via the following procedure.

4.9 Grams of sodium bicarbonate was mixed with 4090 g deionized water and added to a 12-liter reaction kettle equipped with a thermocouple, heating mantle, stirrer, reflux condenser and nitrogen inlet. The mixture was sparged with nitrogen for 43 minutes with stirring and then blanketed with nitrogen. Aerosol MA80-I (46.8 g in 410 g deionized water) was added to the mixture with stirring followed by a 48 g deionized water rinse. The mixture was heated to approximately 50° C. using a heating mantle. Styrene monomer (832.8 g) was added with stirring. The mixture was heated to 60° C. Sodium persulfate (12.5 g in 144 g deionized water) was added to the mixture with stirring. The temperature of the mixture was held constant for 40 minutes. Under agitation, divinylbenzene (205.4 g) was added to the mixture and the temperature was held at approximately 60° C. for 2.3 hours. Brij 35 (polyoxyethylene(23)lauryl ether) (5.0 g in 100 g deionized water) was added to the mixture with stirring. Next, sodium persulfate (3.0 g in 900 g deionized water) was added to the mixture with stirring. A mixture of styrene (200 g), methyl methacrylate (478.8 g), ethylene glycol dimethacrylate (48 g) and divinylbenzene (30.2 g) was added to the reaction mixture with stirring. Sipomer COPS-1 (3-allyloxy-2-hydroxy-1-propanesulfonic acid, 41.3 g) was added to the reaction mixture with stirring and was followed by a (100 g) deionized water charge. The temperature of the mixture was maintained at 60° C. for approximately 4.0 hours. The resulting polymer dispersion was filtered through a five-micron filter bag.

To determine percentage of ionic monomer on the purified particle surface, the following method was performed. Twenty (20) grams of the above dispersion was mixed with 10 g of mixed hydrogen and hydroxide ion exchange resin TMD-8 for 24 hours under stirring. Next, the TMD-8 ion exchange resin was removed from the dispersion.

Approximately 4 g of the dispersion was baked at 110° C. for 1 hour to measure the solid content. Another 4 g of the dispersion was titrated with 0.1 N NaOH to measure the amount of negative charge on the particle surface. It was determined that 0.17 weight percent of COPS-I was in the final polymer dispersion. Therefore, 9 percent of the COPS-I added to the reaction mixture was polymerized on the particle surface.

The polymer dispersion was then ultrafiltered using a 4-inch ultrafiltration housing with a 2.41-inch polyvinylidine fluoride membrane, both from PTI Advanced Filtration, Inc. Oxnard, Calif., and pumped using a peristaltic pump at a flow rate of approximately 170 ml per second. Deionized water (approximately 3000 g) was added to the dispersion after 3000 g of ultrafiltrate had been removed. This exchange was repeated several times until approximately 11500 g of ultrafiltrate had been replaced with 11500 g deionized water. Additional ultrafiltrate was then removed until the solids content of the mixture was approximately 45 percent by weight. The material was applied via slot-die coater from Frontier industrial Technology, Inc., Towanda, Pa. to a 2-mil thick polyethylene terephthalate (PET) substrate and dried at 180° F. for 40 seconds to a dry thickness of approximately 4 microns. The diffraction wavelength and reflectance of the resulting material was measured with a Cary 500 spectrophotometer from Varian, Inc. and are listed in Table 2.

Comparative Example 6

The experiment shown in Comparative Example 5 was repeated, except 82.7 g of COPS-I was used. Using the same method to determine monomer efficiency described in Comparative Example 5, it was determined that 5% of charged COPS-I is on the particle surface. The diffraction wavelength and reflectance of the resulting material was measured with a Cary 500 spectrophotometer and are listed in Table 2.

Example 3

A dispersion of polystyrene-divinylbenzene core/styrene-methyl methacrylate-ethylene glycol dimethacrylate-divinylbenzene shell particles in water was prepared via the following procedure.

4.9 g of sodium bicarbonate, 8.0 g Brij 35 (polyoxyethylene(23)lauryl ether) and 1.5 g sodium styrene sulfonate were mixed with 4090 g deionized water and added to a 12-liter reaction kettle equipped with a thermocouple, heating mantle, stirrer, reflux condenser and nitrogen inlet. The mixture was sparged with nitrogen for 43 minutes with stirring and then blanketed with nitrogen. Aerosol MA80-I (39.4 g in 410 g deionized water) was added to the mixture with stirring followed by a 48 g deionized water rinse. The mixture was heated to approximately 50° C. using a heating mantle. Styrene monomer (832.8 g) was added with stirring. The mixture was heated to 60° C. Sodium persulfate (12.5 g in 144 g deionized water) was added to the mixture with stirring. The temperature of the mixture was held constant for 40 minutes. Under agitation, divinylbenzene (205.4 g) was added to the mixture and the temperature was held at approximately 60° C. for 2.3 hours. Brij 35 (polyoxyethylene(23)lauryl ether) (6.0 g in 100 g deionized water) was added to the mixture with stirring. Next, sodium persulfate (3 g in 900 g deionized water), and 6.0 g sodium styrene sulfonate was added to the mixture with stirring. A mixture of styrene (200 g), methyl methacrylate (478.8 g), ethylene glycol dimethacrylate (48 g) and divinylbenzene (30.2 g) was added to the reaction mixture with stirring. The temperature of the mixture was maintained at 60° C. for approximately 4.0 hours. The resulting polymer dispersion was filtered through a five-micron filter bag.

Using the same method to determine monomer efficiency described in Comparative Example 5, it was determined that 92% of charged sodium styrene sulfonate is on the particle surface.

The polymer dispersion prepared above was then ultrafiltered using a 4-inch ultrafiltration housing with a 2.41-inch polyvinylidine fluoride membrane and pumped using a peristaltic pump at a flow rate of approximately 170 ml per second. Deionized water (approximately 3000 g) was added to the dispersion after 3000 g of ultrafiltrate had been removed. This exchange was repeated several times until approximately 11500 g of ultrafiltrate had been replaced with 11500 g deionized water. Additional ultrafiltrate was then removed until the solids content of the mixture was approximately 45 percent by weight. The material was applied via slot-die coater to a 2-mil thick polyethylene terephthalate (PET) substrate and dried at 180° F. for 40 seconds to a dry thickness of approximately 4 microns. The CCA and reflectance of the resulting material was measured and are listed in Table 2.

Example 4

The experiment shown in Example 3 was repeated, except 4.5 g of sodium styrene sulfonate was used. Using the same method to determine the binding efficiency described in Comparative Example 5, it was determined that 90% of charged sodium styrene sulfonate was bound to the particle surface. The CCA and reflectance of the resulting material are listed in Table 2.

Example 5

The experiment shown in Example 3 was repeated, except 7.5 g sodium styrene sulfonate was used. Using the same method to determine monomer efficiency described in Comparative Example 5, it was determined that 85% of charged sodium styrene sulfonate was bound to the particle surface. The CCA and reflectance of the resulting material was measured and are listed in Table 2.

Comparative Example 7

The experiment shown in Example 3 was repeated, except 9.0 g sodium styrene sulfonate was used. Using the same method to determine monomer efficiency described in Comparative Example 5, it was determined that 78% of charged sodium styrene sulfonate was bound to the particle surface. The CCA and reflectance of the resulting material was measured and are listed in Table 2.

TABLE 2

| Example | Ionic Monomer | Percent Bound Ionic Monomer | Diffraction λ (nm) | % Reflectance |
| --- | --- | --- | --- | --- |
| Comparative Example 5 | COPS-1 | 9% | 513 | 29.0% |
| Comparative Example 6 | COPS-1 | 5% | 515 | 27.0% |
| Example 3 | SSS | 92% | 527 | 31.8% |
| Example 4 | SSS | 90% | 518 | 29.8% |
| Example 5 | SSS | 85% | 514 | 22.1% |
| Comparative Example 7 | SSS | 78% | 506 | 9.2% |

The data of Comparative Examples 5 and 6 and Examples 3-6 demonstrate that while a conventional ionic monomer (COPS-1) may be used to prepare a monodispersion of particles and a CCA that diffracts radiation with acceptable reflectance, significantly less ionic monomer may be used when the ionic monomer (such as sodium styrene sulfonate) has high affinity for binding to the polymeric particles. The binding efficiency (as determined by the percent of ionic monomer bound to the particles of the total amount of ionic monomer added to the reaction mixture) of sodium styrene sulfonate used in Examples 3-5 was at least an order of magnitude greater than the surfactant binding efficiency of COPS-1 used in Comparative Examples 5 and 6.

Examples 3-5 used varying total amounts of sodium styrene sulfonate. However, as indicated by Comparative Example 7, an excessive concentration of sodium styrene sulfonate may be detrimental and result in lower percent total bound surfactant. At some concentrations of surfactant, the binding efficiency may decrease and/or the ability of the particles to form an ordered array may be adversely effected when the amount of surfactant in the particle dispersion becomes excessive.

While the preferred embodiments of the present invention are described above, obvious modifications and alterations of the present invention may be made without departing from the spirit and scope of the present invention. The scope of the present invention is defined in the appended claims and equivalents thereto.

The invention claimed is:

1. A method of preparing an ordered periodic array of particles comprising:
   dispersing monomers in an emulsion containing an ionic monomer, wherein the monomer has a solubility in water that is less than the water solubility of 3-allyloxy-2-hydroxyl-1-propanesulfonic acid (COPS I);
   polymerizing the dispersed monomers to produce monodispersed polymeric particles wherein at least 50% of the ionic monomer in the dispersion is bound to the polymeric particles;
   applying the dispersion onto a substrate, whereby the particles self-align into an ordered periodic array; and
   drying the array so that the array is non-gelatinous and substantially solid.

2. The method of claim 1, wherein at least 70% of the ionic monomer in the dispersion is bound to the polymeric particles.

3. The method of claim 1, wherein at least 90% of the ionic monomer in the dispersion is bound to the polymeric particles.

4. The method of claim 1, wherein said ionic monomer comprises sodium styrene sulfonate.

5. The method of claim 4, wherein said polymeric particles comprise polymer selected from the group consisting of polystyrene, an acrylic polymer, polyurethane, an alkyd polymer, a polyester, a siloxane-containing polymer, a polysulfide, and an epoxy-containing polymer.

6. The method of claim 1, wherein said polymeric particles comprise polymer selected from the group consisting of polystyrene, an acrylic polymer, polyurethane, an alkyd polymer, a polyester, a siloxane-containing polymer, a polysulfide, and an epoxy-containing polymer.

7. The method of claim 1, wherein said polymeric particles have a core-shell structure.

8. The method of claim 1, further comprising coating the array of particles with a matrix and curing the matrix to fix the array of particles within the matrix.

9. The method of claim 8, wherein the particles comprise polymer selected from the group consisting of polystyrene, an acrylic polymer, polyurethane, an alkyd polymer, a polyester, a siloxane-containing polymer, a polysulfide, and an epoxy-containing polymer.

10. The method of claim 9, wherein the particles have a core-shell structure.

11. The method of claim 9, wherein the matrix comprises an acrylic polymer, polyurethane, an alkyd polymer, a polyester, a siloxane-containing polymer, a polysulfide, and an epoxy-containing polymer.

12. An ordered periodic array of particles produced according to the method of claim 1.

13. An ordered periodic array of particles produced according to the method of claim 4.

14. An ordered periodic array of particles produced according to the method of claim 8.

* * * * *